(12) United States Patent
Vester

(10) Patent No.: US 8,698,500 B2
(45) Date of Patent: Apr. 15, 2014

(54) MAGNETIC RESONANCE TOMOGRAPHY SYSTEM

(75) Inventor: Markus Vester, Nürnberg (DE)

(73) Assignee: Siemens Aktiengesellschaft, München (DE)

( * ) Notice: Subject to any disclaimer, the term of this patent is extended or adjusted under 35 U.S.C. 154(b) by 244 days.

(21) Appl. No.: 13/173,888

(22) Filed: Jun. 30, 2011

(65) Prior Publication Data

US 2012/0217965 A1 Aug. 30, 2012

(30) Foreign Application Priority Data

Jul. 2, 2010 (DE) .......................... 10 2010 025 917

(51) Int. Cl.
*G01V 3/00* (2006.01)

(52) U.S. Cl.
USPC .......................................... 324/322; 324/318

(58) Field of Classification Search
USPC .................... 324/322, 318, 309, 307; 600/422
See application file for complete search history.

(56) References Cited

U.S. PATENT DOCUMENTS

| | | | |
|---|---|---|---|
| 4,881,034 A | 11/1989 | Kaufman et al. | |
| 5,461,314 A * | 10/1995 | Arakawa et al. | 324/318 |
| 5,928,148 A * | 7/1999 | Wang et al. | 600/420 |
| 6,097,186 A * | 8/2000 | Nabetani | 324/319 |
| 6,323,648 B1 * | 11/2001 | Belt et al. | 324/322 |
| 6,940,282 B2 * | 9/2005 | Dumoulin et al. | 324/318 |
| 6,975,114 B1 | 12/2005 | Ledden | |
| 7,268,554 B2 | 9/2007 | Vaughan | |

FOREIGN PATENT DOCUMENTS

| | | |
|---|---|---|
| DE | 195 02 374 A1 | 10/1996 |
| DE | 103 56 273 A1 | 6/2005 |
| DE | 103 14 215 B4 | 11/2006 |
| EP | 0 396 804 A1 | 11/1990 |

OTHER PUBLICATIONS

German Office Action dated Jun. 8, 2011 for corresponding German Patent Application No. DE 10 2010 025 917.9 with English translation.
A. Trakic et al., "A mechanically rotating RF transceive system and method for applications in Magnetic Resonance," The School of Information Technology and Electrical Engineering, The University of Queensland, Brisbane, Australia, 2009, p. 4149.
B. Beck et al., "A Novel Pin Diode Switch Design For Large Volume Arrays At 11.1T," National High Magnetic Field Laboratory 2006 Research Report, 2006.
A. Trakic et al., "A Rapidly Rotating RF Coil for MRI," The School of Information Technology and Electrical Engineering, The University of Queensland, Brisbane, Australia, 2006, pp. 59-66.
A. Trakic et al., "MRI with a rapidly Rotating RF Coil," The School of Information Technology and Electrical Engineering, The University of Queensland, Brisbane, Australia, 2009, p. 3221.

* cited by examiner

*Primary Examiner* — Louis Arana
(74) *Attorney, Agent, or Firm* — Lempia Summerfield Katz LLC

(57) ABSTRACT

The present embodiments relate to a magnetic resonance tomography system that includes antenna elements and a controller for selection of the antenna elements. The controller is configured to select antenna elements that surround a field of view of the magnetic resonance tomography system in succession one after the other.

27 Claims, 3 Drawing Sheets

MAGNETIC RESONANCE TOMOGRAPHY SYSTEM

This application claims the benefit of DE 10 2010 025 917.9, filed Jul. 2, 2010.

BACKGROUND

The present embodiments relate to a magnetic resonance tomography (MRT) system and a method.

Magnetic resonance devices for the examination of objects or patients using magnetic resonance tomography are, for example, known from: DE10314215B4; U.S. Pat. No. 4,881,034; U.S. Pat. No. 6,975,114, U.S. Pat. No. 7,268,554; Beck, Li, Crozier "A novel Pin Diode Switch Design for large volume arrays at 11.1 T national high magnetic high magnetic field laboratory 2006 research report;" Trakic, Weber, Li, Wang, Crozier, "MRI with a rapidly Rotating RF Coil," ISMRM, 2009: p. 3221;" Trakic, Li, Weber, Liu, Wilson, Crozier, "A mechanically rotating RF transceive system and method," Applications in Magnetic Resonance," ISMRM, 2009: p. 4149; Trakic, Li, Weber, Wang, Wilson, Crozier, "A Rapidly Rotating RF Coil for MRI;" and "Concepts in Magnetic Resonance Part B," Magnetic Resonance Engineering), DOI 10.1002/cmr.b.

In the publications cited above, Trakic, Crozier et al. describe an MR antenna system with a high frequency (HF) coil rotating mechanically about a patient. This may be used both for transmission and for reception.

SUMMARY AND DESCRIPTION

In comparison to the known array antennas, just one single receive or transmit channel is used. The system for generation and analysis of the high frequency signals may be simple and of reasonable cost. In addition, the technical difficulties that may arise from a coupling between different antenna elements do not apply. Using a variation of the aspect angle, a sequential diversity of the possible transmit and receive profile may be achieved. In combination with suitable analysis methods, this may enable both a more homogeneous transmit illumination and a speeding-up of the received data acquisition through fewer phase coding steps.

The present embodiments may obviate one or more of the drawbacks or limitations in the related art. For example, a magnetic resonance tomography (MRT) system may be optimized.

In one embodiment, the high-frequency (HF) coil of an MRT may be optimized with a controller using, for example, successively selected antenna elements circulating around an MRT field of view FoV. The successively selected antenna elements surround the MRT field of view FoV.

One embodiment includes the replacement of a mechanical rotation of an antenna element using an electronic selection of an element from an antenna array. The circuit may be configured such that a different number of transmitters (ns) and receivers (ne) may be connected to a larger number of antennae (na) (FIG. 1). In the simplest case (ns=ne=1), there is just one changeover switch with a single transmit-receive input and na outputs.

DETAILED DESCRIPTION OF THE DRAWINGS

Figure 4:
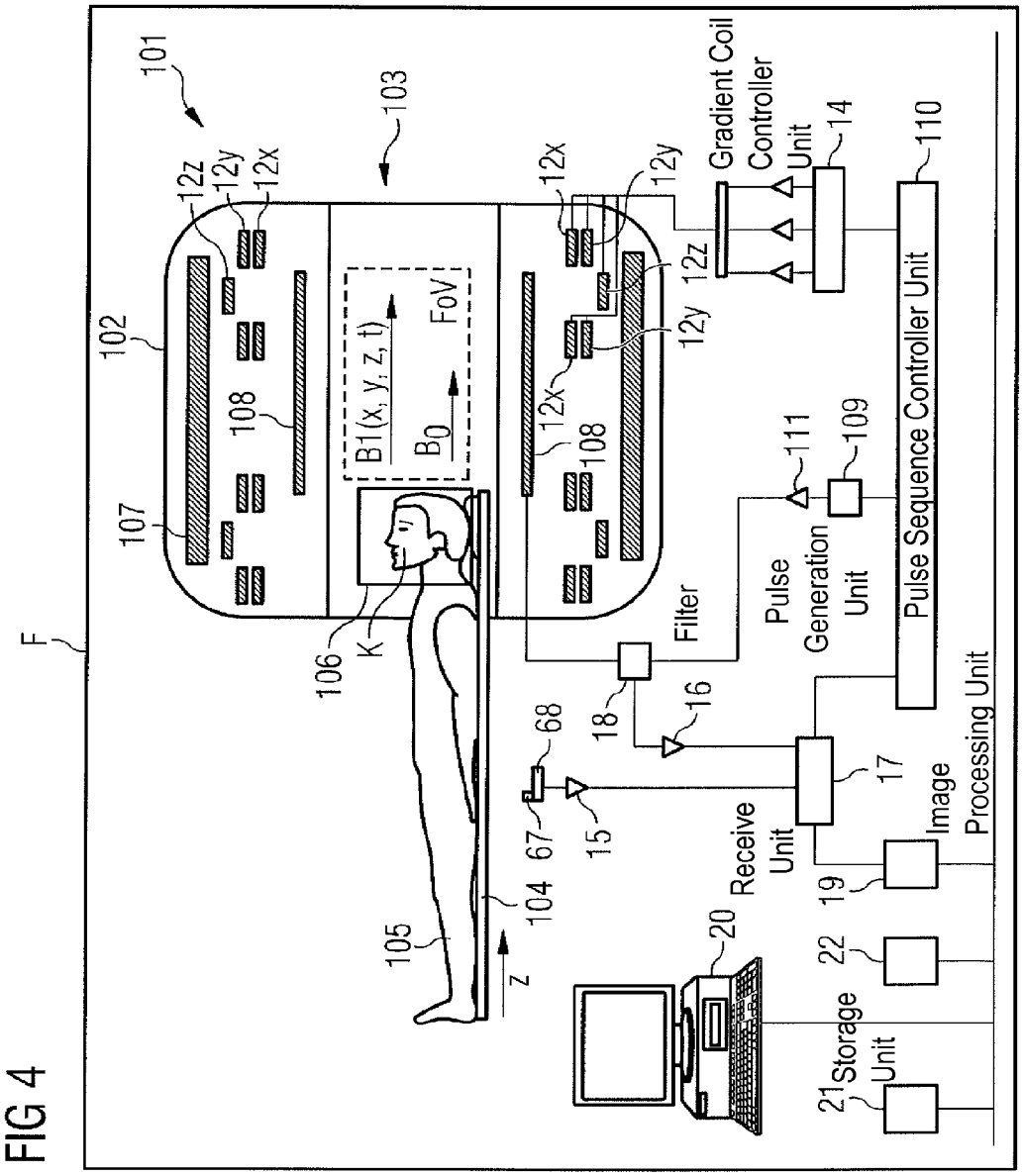
FIG. 4 shows an example MRT system.

FIG. 4 shows (e.g., in a space insulated with a Faraday cage F) an imaging magnetic resonance device MRT 101 with a whole body coil 102 with a tube-like or laterally open aperture 103 (e.g., surrounding a field of view FoV of the MRT 101 with a housing wall) for an object to be examined. A patient couch 104 with the object to be examined such as, for example, a patient 105 (e.g., with a local coil arrangement 6) may be conveyed into the aperture 103 in the direction of the arrow z into the field of view FoV in order to generate scans of the patient 105. A local coil arrangement 106 may be positioned on the patient 105. If the patient 105 in shifted in the direction z as far as the FoV, scans of a local area (e.g., the head K) may be made with the local coil arrangement. Signals from the local coil arrangement 106 may be analyzed (e.g., converted into images and stored or displayed) by an analysis device (e.g., elements 67, 66, 15, 17) of the MRT 101 connectable to the local coil arrangement 106, for example, using coaxial cable.

In order to examine the body 105 (e.g., the object to be examined or the patient) with an imaging magnetic resonance device MRT 101 using magnetic resonance imaging, different magnetic fields, harmonized with each other in temporal and spatial characteristics, may be beamed at or transmitted to the body 105. A powerful magnet 107 (e.g., a cryomagnet) in a measurement cabin with a tunnel-shaped opening 3, for example, generates a statically powerful main magnetic field $B_0$ that is, for example, 0.2 Tesla to 3 Tesla or even more in strength. The body to be examined 105 placed on the patient couch 104 is conveyed into an essentially homogeneous area of the main magnetic field B0 in the field of view FoV. An excitation of the nuclear spin of nuclei of the body 105 takes place using magnetic high frequency excitation pulses. The magnetic high frequency excitation pulses are transmitted via a high frequency antenna shown in FIG. 4 in simplified form as a body coil 108 (and/or a local coil arrangement). The magnetic high frequency excitation pulses are, for example, generated by a pulse generation unit 109 that is controlled by a pulse sequence controller unit 110. After amplification using a high frequency amplifier 111, the amplified magnetic high frequency excitation pulses are directed to the high frequency antenna 108. The high frequency system shown in FIG. 4 is depicted in schematic form only. In other embodiments, more than one pulse generation unit 109, more than one high frequency amplifier 111 and a plurality of high frequency antennae 108 a, b, c are employed in the imaging magnetic resonance device MRT 101.

The imaging magnetic resonance device MRT 101 may also include gradient coils 12x, 12 y, 12 z, with which during a measurement, magnetic gradient fields are beamed for selective layer excitation and for spatial encoding of the measurement signal. The gradient coils 12x, 12 y, 12 z are controlled by a gradient coil controller unit 14 that, like the pulse generation unit 9, is connected to the pulse sequence controller unit 110.

The signals transmitted by the excited nuclear spin are received by the body coil 108 and/or at least one local coil arrangement 106, amplified by assigned high frequency preamplifiers 16 and further processed and digitized by a receive unit 17. The recorded measuring data is digitized and stored as complex numerical values in a k-space matrix. An associated magnetic resonance (MR) image may be reconstructed from the k-space matrix populated with values using a multidimensional Fourier transformation.

In the case of a coil that may be operated both in the transmit and the receive mode (e.g., the body coil 108 or a local coil), the correct signal transduction may be regulated using an upstream branching filter 18.

An image processing unit 19 generates an image from the measurement data. The image is displayed to a user via an operator console 20 and/or stored in a storage unit 21. A central arithmetic unit 22 controls the individual system components.

In MR tomography, images with a high signal-to-noise ratio (SNR) are recorded with local coil arrangements (e.g., coils, local coils). The local coil arrangements are antenna systems that are arranged in the immediate vicinity on (anterior), under (posterior) or in the body. During an MR measurement, the excited nuclei induce a voltage in the individual antennae of the local coil. The induced voltage is amplified with a low noise preamplifier (e.g., LNA, preamp) and forwarded to the receive electronics. To improve the signal-to-noise ratio, including in the case of high-resolution images, high field system are employed (e.g., 1.5 T or 3 T and more).

The local coil system 106 may, for example, include one antenna element or as an array coil, a plurality of antenna elements (e.g., coil elements). A receiver 68 arranged on the system side filters and digitizes signals received by the local coil 106, for example, via radio or cable and forwards the data to digital signal processing. The digital signal processing may derive an image or a spectrum from the data obtained from the measurement and makes the image available to a user, for example, for subsequent diagnosis by the user or for storage.

The exemplary embodiments represented in FIGS. 1-3*b* are described in more detail below.

Figure 1:
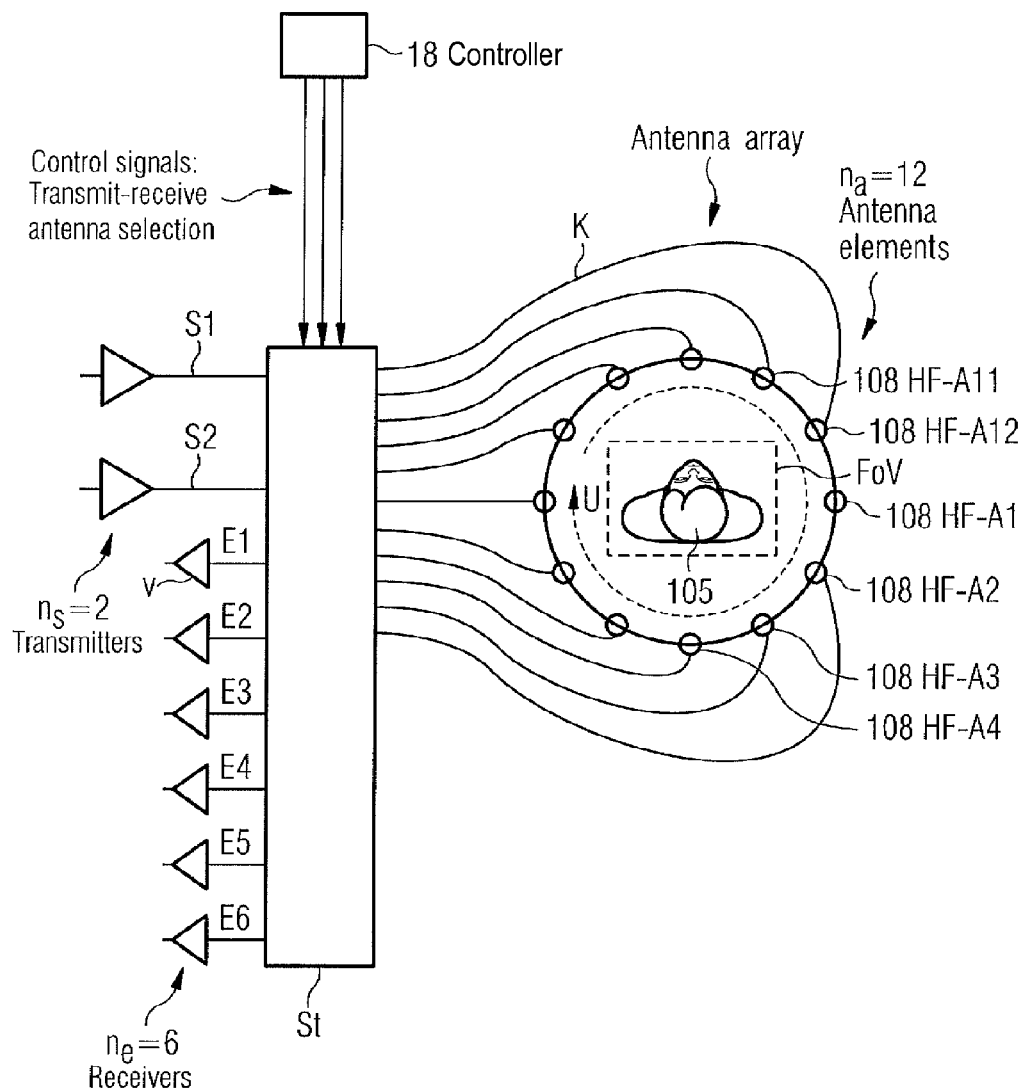
FIG. 1 shows a cross-sectional view of one embodiment of an antenna array of one embodiment of a magnetic resonance tomography (MRT) system and actuation of the antenna array.

FIG. 1 shows in schematic, cross-sectional form an MRT HF antenna array 108 provided with twelve antenna elements 108HF-A1 to 108HF-A12 (e.g., of around the same size and equidistant from each other) of one embodiment of an MRT system and actuation of the MRT HF antenna array 108 (for reasons of clarity given reference characters in some cases only).

One embodiment according to FIG. 1 includes the replacement of a mechanical rotation of an antenna element provided for in the stated prior art with an electronic selection (St, Sch) of an antenna element 108HF-A1 to 108HF-A12 from an array as the transmitter/receiver. The circuit may be configured such that a different number of transmit inputs S1, S2 and transmitters (ns), and receive inputs E1, E2, ... E6 and receivers (ne) may be connected to a larger number (na) of antenna elements 108HF-A1 to 108HF-A12 (FIG. 1). In the simplest case (e.g., ns=ne=1, thus only one transmitter and only one receiver), there is just one changeover switch with a single transmit-receive input S1 and na outputs for one antenna element.

The controller 18 thus selects (e.g., in each case as transmitter and/or receiver), for example, the antenna elements 108HF-A1 to 108HF-A12 in succession (e.g., sequentially) in the peripheral direction (e.g., along a path U around the MRT image field of view (FoV) in the direction of the arrow U) around the field of view (e.g., via switches). Thus, for example, in the following sequence, first 108HF-A1, then 108HF-A2, then 108HF-A3, then 108HF-A4, then 108HF-A5, then 108HF-A6, then 108HF-A7, then 108HF-A8, then 108HF-A9, then 108HF-A10, then 108HF-A11, and then 108HF-A12 transmits and/or receives. The same antenna elements may be selected as transmitter and receiver; the selection of antenna elements as transmitters may also take place independently of the selection of antenna elements as receivers. An antenna element selected as a transmitter is, for example, connected to a transmit input of the controller (and/or an output of a transmit amplifier). An antenna element selected as a receiver is, for example, connected to a receive output (and/or input of a receive amplifier).

The antenna elements 108HF-A1 to 108HF-A12 are located on the periphery, for example, of a ring (e.g., in an annular housing or carrier) distributed around the field of view FoV of the magnetic resonance tomography system 101 (e.g., at equal distances from each other) on more than two sides of the FoV (e.g., above, below, and on two lateral sides seen from the left and right of a patient lying on their back in the MRT). The antenna elements 108HF-A1 to 108HF-A12 may be located along any desired line U (e.g., essentially circular, essentially elliptical or essentially "D"-shaped; closed, indicated as a dotted arrow) around the field of view (e.g., in a housing of the MRT).

Figure 2:
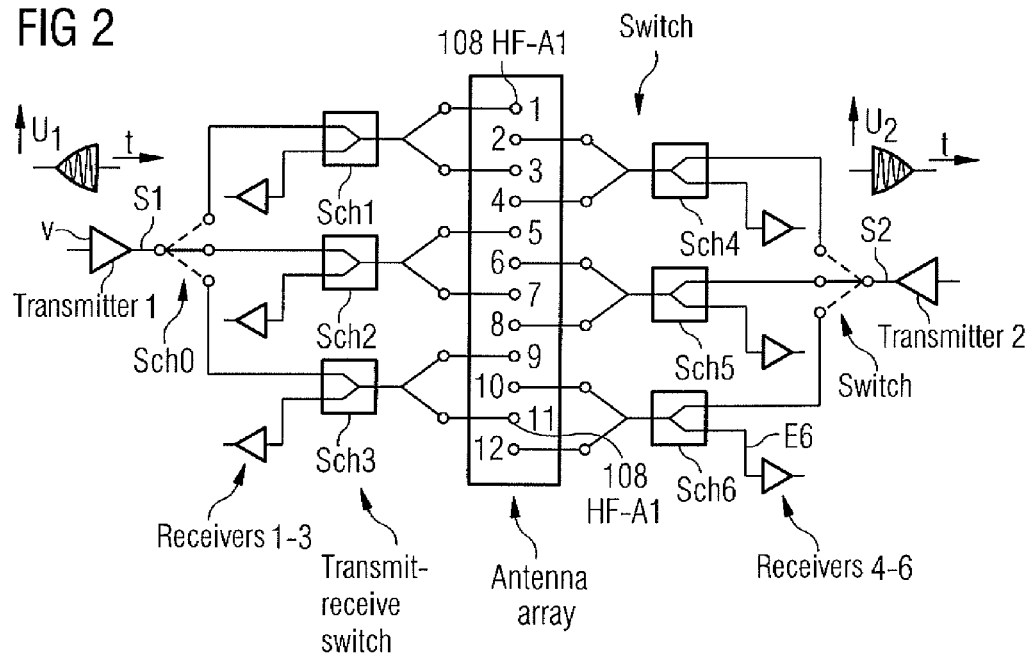
FIG. 2 shows one embodiment of an actuation of an antenna array.
Figure 3:
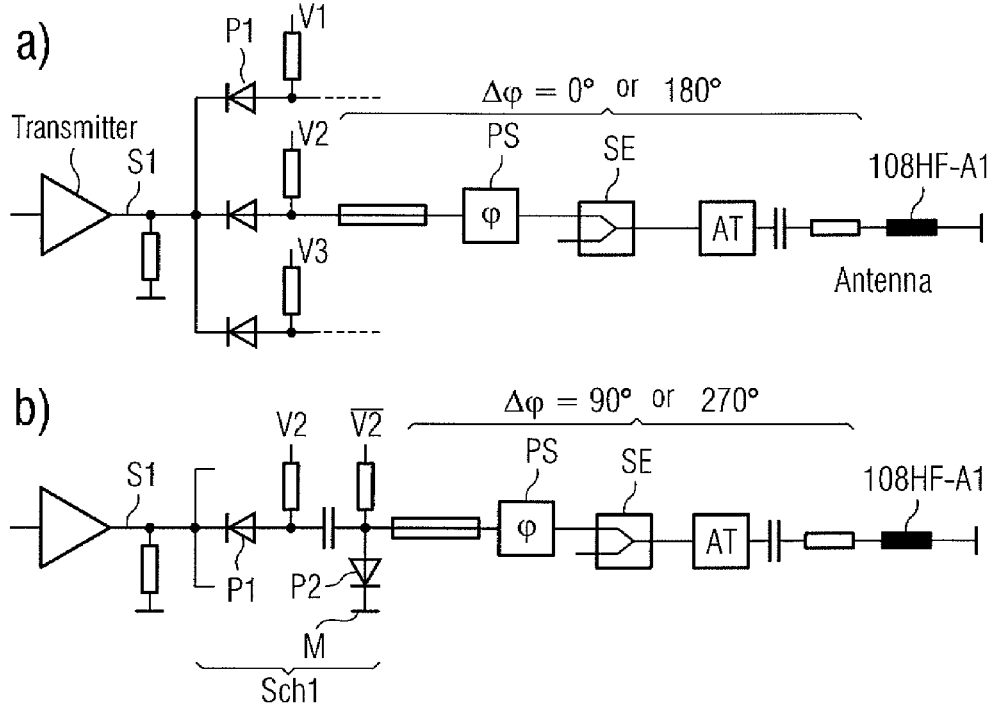
FIG. 3a shows one embodiment of an actuation of an antenna array.
FIG. 3b shows one embodiment of an actuation of an antenna array.

With antenna arrays realizable with comparatively little effort (e.g., up to 16 antenna elements on the periphery of a ring around the field of view FoV), the angular distance between adjacent antennae positions may be greater than in the case of a "rotating" antenna with many (e.g., >16) antenna elements (e.g., through the successive switching-on of the antenna elements). This is, however, of no great practical advantage, as the antenna profile of neighboring antenna elements (and/or their illumination in the object to be examined) are already very similar (e.g., in the interior of the object to be examined). With the use (in each case, simultaneously with each other) of at least two, for example, adjacent antenna elements as transmitters (or receivers), a rapidly variable interpolation between the discrete positions of the antenna elements may also be performed. For example, a transmitter S1 may be successively connected to all even-numbered antenna elements (e.g., antenna elements 108HF-A2, 108HF-A4 ... 108HF-A12 or respectively indicated amplifiers and/or preamplifiers V), and another transmitter S2 may be successively connected to all odd-numbered antenna elements (e.g., antenna elements 108HF-A1, 108HF-A3 ... 108HF-A11 or respectively indicated amplifiers and/or preamplifiers V, via switches Sch0-Sch6 (e.g., high-speed switches). The relative strength of the two transmit signals may be dynamically varied using the transmitter actuation St (FIG. 2).

A phase (e.g., electrical length of a connecting cable K) between switch outputs of the switches Sch0-Sch6 and the antenna elements may in each case be set such that unused branches (e.g., thus, unused transmitters) appear as electrically neutral on the antenna elements assigned to the unused branches, so that no current may be induced in the unused antenna elements.

As the high-speed switches Sch 1, Sch2 to Sch6 (in the case of six switches as in FIG. 2, it may also, for example, be twelve switches or one per antenna element) PIN diodes P1 that, for example, may be rendered conductive in a few microseconds using a switched direct current or blocked using a reverse voltage for high transmit voltages are suitable.

In the embodiment shown in FIG. 3*a*, a PIN diode P1 is positioned in each branch (e.g., between an antenna element and a corresponding switch element and/or transmitter and/or receiver). Unused switch branches have a high output impedance. The connection to antennae resonant circuits (e.g., in each case) includes a cable K, an optional phase shifter PS, an optional transmit-receive switch SE (e.g., for the connection of an antenna element to a transmitter and/or receiver or to nothing), and a matching circuit AR. The length of the cable K and/or of the phase shifter PS are designed such that the signal phase between the switch and the antenna in each branch amounts to 0° or 180°.

In the embodiment shown in FIG. 3b, a second PIN diode P2 lies between a switch output and ground M. The second PIN diode P2, in the case of non-use of the branch, is switched on, and a short-circuit generated. The insulation of the switch may thereby be improved and the first PIN diode P1 released for voltages that may be coupled in from the output. In order to transform this short circuit into neutral at the antenna, a total phase of 90° or 270° may be selected.

If, as in FIG. 2, a plurality of switches (e.g., switch Sch0 and switches Sch1/Sch2/Sch3 to Sch0) are cascaded (or switched in parallel), then by switching on matching lines K and/or phase shifters PS between the switch levels, a prescribed phase condition for each combination of switch output and antenna elements may be realized.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A magnetic resonance tomography system comprising:
antenna elements; and
a controller operable for selection of the antenna elements,
wherein the controller is operable to select the antenna elements that surround a field of view of the magnetic resonance tomography system in succession,
wherein the controller is operable for selection of the antenna elements as transmitters, receivers, or transmitters and receivers;
wherein the controller is operable to select the antenna elements in a direction in succession around the field of view, such that the antenna elements are each selected as a transmitter, a receiver, or a transmitter and receiver, and
wherein the controller is configured to effect, repeatedly, a rotating selection of the antenna elements in a peripheral direction around the field of view.

2. The magnetic resonance tomography system as claimed in claim 1, wherein the controller is operable to effect a rotating selection of the antenna elements in a peripheral direction around the field of view using the successive selection.

3. The magnetic resonance tomography system as claimed in claim 1, wherein the controller is operable to actuate the antenna elements successively in a sequence, and
wherein the controller is operable to repeatedly actuate the antenna elements successively in the sequence.

4. The magnetic resonance tomography system as claimed in claim 3, wherein the controller is operable to actuate the antenna elements successively in the sequence or another sequence as long as an imaging scan is taking place in the magnetic resonance tomography system.

5. The magnetic resonance tomography system as claimed in claim 1, wherein the antenna elements are arranged along a closed arc surrounding the field of view, the antenna elements being selected successively one after the other.

6. The magnetic resonance tomography system as claimed in claim 1, wherein the antenna elements are located on an essentially circular line around the field of view.

7. The magnetic resonance tomography system as claimed in claim 1, wherein the antenna elements are located on a line around the field of view, the line being curved in one direction only.

8. The magnetic resonance tomography system as claimed in claim 7, wherein the one direction only is a direction around the field of view.

9. The magnetic resonance tomography system as claimed in claim 1, wherein the antenna elements are in a peripheral direction at least essentially at the same distance from each other.

10. The magnetic resonance tomography system as claimed in claim 1, wherein the antenna elements are in a peripheral direction at least essentially located at the same distance from the center of the field of view.

11. The magnetic resonance tomography system as claimed in claim 1, wherein at least eight and a maximum of sixteen of the antenna elements are provided in an arc distributed around the field of view.

12. The magnetic resonance tomography system as claimed in claim 1, wherein the antenna elements surround the field of view of the magnetic resonance tomography system on more than two sides.

13. The magnetic resonance tomography system as claimed in claim 12, wherein the antenna elements surround the field of view of the magnetic resonance tomography system on at least four sides.

14. The magnetic resonance tomography system as claimed in claim 12, wherein the antenna elements surround the field of view of the magnetic resonance tomography system above, below and on two lateral sides of the field of view.

15. The magnetic resonance tomography system as claimed in claim 1, wherein the number of antenna elements is greater than the number of transmit channels and greater than the number of receive channels.

16. The magnetic resonance tomography system as claimed in claim 1, wherein the controller comprises a changeover switch with a single transmit-receive input and a plurality of outputs to the antenna elements.

17. The magnetic resonance tomography system as claimed in claim 1, wherein at each point in time, only a single receive channel, transmit channel, or receive and transmit channel is in use, only one of the antenna elements is active as a transmitter or a receiver, or at each point in time, only a single receive channel, transmit channel, or receive and transmit channel is in use and only one of the antenna elements is active as the transmitter or the receiver.

18. The magnetic resonance tomography system as claimed in claim 1, wherein at least two of the antenna elements are selectable simultaneously as a transmitter by the controller.

19. The magnetic resonance tomography system as claimed in claim 1, wherein at least two of the antenna elements are selectable simultaneously as a receiver by the controller.

20. The magnetic resonance tomography system as claimed in claim 1, wherein the controller is operable to select only each nth one of the antenna elements successively as a transmitter, a receiver, or a transmitter and receiver in a peripheral direction by the controller, and
wherein n is a positive number greater than one.

21. The magnetic resonance tomography system as claimed in claim 1, wherein using lengths of cables between an output of a switch and one of the antenna elements, phases of temporal activation of the antenna elements are each selected such that unused branches to the antenna elements appear on the antenna elements as electrically neutral, so that no current is inducible in the unused antenna elements.

22. The magnetic resonance tomography system as claimed in claim 1, further comprising a switch actuated by the controller for the switching on and off of reception, transmission, or reception and transmission via one of the antenna elements, and wherein the switch is a PIN diode.

23. The magnetic resonance tomography system as claimed in claim 1, wherein cable length of a cable between an output of a switch and one of the antenna elements or a phase shifter between the output of the switch and the one antenna element is selected such that a signal phase between the switch and the one antenna element in each branch amounts to 0° or 180°.

24. The magnetic resonance tomography system as claimed in claim 1, wherein a PIN diode lies between a switch output and ground, and wherein the PIN diode is rendered conductive in an unused state of a branch to one of the antenna elements.

25. The magnetic resonance tomography system as claimed in claim 1, wherein the antenna elements together comprise a high-frequency whole body coil of the magnetic resonance tomography system.

26. The magnetic resonance tomography system as claimed in claim 1, wherein the magnetic resonance tomography system is configured such that high frequency magnetic resonance tomography excitation pulses are transmitted from one of the antenna elements that is in a transmit phase.

27. A method for selecting antenna elements of a magnetic resonance tomography system, the method comprising:

selecting, using a controller, antenna elements that surround a field of view of the magnetic resonance tomography system, wherein selecting comprises:

selecting the antenna elements in succession one after the other in peripheral direction around the field of view, such that the antenna elements are each selected as a transmitter, a receiver, or a transmitter and receiver, the selecting being a rotating selecting.

* * * * *